United States Patent
Okunaka et al.

(10) Patent No.: US 7,786,666 B2
(45) Date of Patent: Aug. 31, 2010

(54) ORGANIC ELECTROLUMINESCENT DISPLAY DEVICE

(75) Inventors: Masaaki Okunaka, Fujisawa (JP); Masato Ito, Mobara (JP); Masamitsu Furuie, Mobara (JP); Hironori Toyoda, Mobara (JP); Naoyuki Itou, Yokohama (JP)

(73) Assignee: Hitachi Displays, Ltd., Chiba (JP)

( * ) Notice: Subject to any disclaimer, the term of this patent is extended or adjusted under 35 U.S.C. 154(b) by 632 days.

(21) Appl. No.: 11/526,751

(22) Filed: Sep. 26, 2006

(65) Prior Publication Data

US 2007/0069640 A1 Mar. 29, 2007

(30) Foreign Application Priority Data

Sep. 27, 2005 (JP) ............................. 2005-279658

(51) Int. Cl.
*H01L 51/00* (2006.01)
(52) U.S. Cl. ...................................... 313/504; 313/512
(58) Field of Classification Search ................. 313/504, 313/506, 512; 428/690, 917
See application file for complete search history.

(56) References Cited

U.S. PATENT DOCUMENTS

| 5,882,829 | A  | * | 3/1999 | Hsieh et al. | ............... | 430/58.15 |
| 2004/0009368 | A1 | * | 1/2004 | Otani et al. | .................. | 428/690 |
| 2004/0062947 | A1 | * | 4/2004 | Lamansky et al. | ........... | 428/690 |
| 2005/0212413 | A1 | * | 9/2005 | Matsuura et al. | ............. | 313/504 |
| 2006/0138945 | A1 | * | 6/2006 | Wolk et al. | .................. | 313/506 |

FOREIGN PATENT DOCUMENTS

| JP | 05-258859 | 10/1993 |
| JP | 05-258860 | 10/1993 |
| JP | 05-275172 | 10/1993 |

* cited by examiner

*Primary Examiner*—Karabi Guharay
(74) *Attorney, Agent, or Firm*—Antonelli, Terry, Stout & Kraus, LLP.

(57) ABSTRACT

An organic electroluminescent display device with an extended lifetime is provided. When at least a hole transport layer HTR, a light emitting layer LUM, an electron transport layer ETR and an electron injection layer EIN are stacked between one electrode (an anode AND or a cathode CTD) formed on the principal surface of an insulating substrate SUB1 and the other electrode (the cathode CTD or the anode AND) by vapor deposition, the concentration of a plasticizer trapped into the layers in a vapor deposition apparatus is limited to less than or equal to 100 ppm.

13 Claims, 7 Drawing Sheets

ORGANIC ELECTROLUMINESCENT DISPLAY DEVICE

CROSS-REFERENCE TO RELATED APPLICATIONS

The disclosure of Japanese Patent Application No. P2005-279658 filed on 2005, Sep. 27 (yyyy/mm/dd) including the claims, the specification, the drawings and the abstract is incorporated herein by reference in its entirety.

BACKGROUND

1. Field of the invention

The present invention relates to an organic electroluminescent display device, and is particularly suitable for an organic electroluminescent display device in which extended lifetime and improved reliability are achieved by preventing reduction in luminous efficiency due to a plasticizer trapped in an organic electroluminescent element during a manufacturing process of the same.

2. Description of Related Art

As a flat panel display device, a liquid crystal display device (LCD), a plasma display device (PDP), a field emission display device (FED), an organic electroluminescent display device (hereinafter also referred to as an OLED element) and the like are in practical use or under development for practical use. Among them, the organic electroluminescent display device representing a thin, lightweight emissive display device is a particularly promising future display device.

The organic electroluminescent display device is classified into so-called bottom emission and top emission types. In the bottom emission type organic electroluminescent display device, an organic electroluminescent element has a light emitting structure in which a transparent electrode (such as ITO) as a first electrode or one electrode, an organic multi-layer film that emits light by application of an electric field (also referred to as an organic light emitting layer), and a reflective metal electrode as a second electrode or the other electrode are sequentially stacked on an insulating substrate, preferably a glass substrate. A plurality of the organic electroluminescent elements are arranged in a matrix and their stacked structures are covered by another substrate referred to as an encapsulation can in order to separate the light emitting structure from outer atmosphere. For example, the transparent and metal electrodes are used as an anode and a cathode, respectively, and an electric field is applied across these electrodes to inject carriers (electrons and holes) into the organic multilayer film, resulting in light emission from the organic multilayer film. The emitted light exits through the glass substrate to the outside.

On the other hand, the top emission type organic electroluminescent display device uses a reflective metal electrode as the above-mentioned one electrode and a transparent electrode, such as ITO, as the other electrode, applies an electric field across these electrodes to cause the organic multilayer film to emit light, and outputs the emitted light through the above-mentioned other electrode. The top emission type uses a transparent substrate (an encapsulation substrate), preferably a glass plate, as the encapsulation can in the bottom emission type.

The principle of how the organic electroluminescent element (hereinafter also referred to as the OLED element) emits light is as follows: That is, electrons, which is one carrier, from the cathode and holes, which is the other carrier, from the anode are injected to the multilayer film containing an organic fluorescent material. When the carriers are recombined in the organic layer, excitons are produced. When the excitons return to the ground state, they emit light.

The OLED element is typically formed of multiple organic layers stacked on a substrate. Typically, the OLED element is often formed of four organic layers including a hole injection layer, a hole transport layer, an emitting layer and an electron transport layer, or five organic layers further including an electron injection layer on the electron transport layer. Related art of this type is disclosed, for example, in JP-A-5-258859, JP-A-5-258860 and JP-A-5-275172.

SUMMARY

The most important issue about the OLED element is to extend the lifetime thereof. It has not been well understood what degrades the luminance and the voltage-current characteristic of the OLED element over emission time. Although it has been pointed out that the degradation may result from materials, element structures, vapor deposition processes and the like, the details are presently unclear. An object of the invention is to provide an organic electroluminescent display device using an OLED element with an extended lifetime.

The inventors have been studying how the lifetime of an OLED element is extended and discovered that a plasticizer trapped in the element during an element manufacturing process contributes to the degradation. The amount of the plasticizer contained in the OLED element according to the invention is less than or equal to 100 ppm, preferably less than or equal to 10 ppm.

An organic electroluminescent display device is a display with OLED elements integrated therein. Since the lifetime of the organic electroluminescent display device substantially depends on the lifetime of each of the OLED elements, an extended lifetime of the organic electroluminescent display device can be achieved by extending the lifetime of the OLED element.

DETAILED DESCRIPTION OF THE INVENTION

Firstly, the principle of operation of an OLED element will be described in detail.

Figure 1:
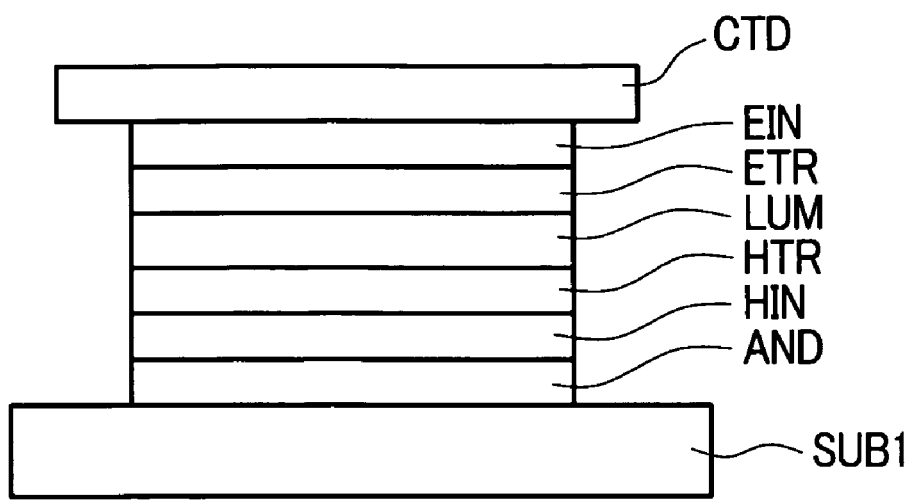
FIG. 1 is a diagrammatic cross-sectional view for explaining an exemplary structure of an OLED element.

FIG. 1 is a diagrammatic cross-sectional view for explaining an exemplary structure of an OLED element. The configuration of the OLED element will be described in detail with reference to FIG. 1. One electrode, which is an anode AND (typically made of ITO (Indium-Tin-Oxide)) in this embodiment, is first deposited on the principal surface of an insulating substrate SUB1, for example, made of glass. On the anode AND are sequentially deposited a hole injection layer HIN, a hole transport layer HTR, a light emitting layer LUM, an electron transport layer ETR, an electron injection layer EIN (typically made of lithium fluoride), and the other electrode, which is a cathode CTD in this embodiment. Among these layers, the hole injection layer, hole transport layer, light emitting layer and electron transport layer are formed, for example, by vapor deposition of organic materials.

The hole injection layer HIN and hole transport layer HTR function to transport the holes injected from the anode AND to the light emitting layer LUM, while the electron transport layer ETR functions to transport the electrons injected from the cathode CTD to the light emitting layer LUM. The light emitting layer LUM is typically an organic film in which a host material having a function of transporting carriers (holes, electrons) and a guest material (dopant) having a function of emitting fluorescence are co-vapor deposited, and the holes injected from the hole transport layer HTR and the electrons injected from the electron transport layer ETR are recombined in the molecules in the light emitting layer LUM.

When the holes and electrons are recombined in the dopant molecules, excitons are directly formed. On the other hand, when they are recombined in the host molecules and excitons of the host molecules are formed, the energy of the excitons is transferred to the dopants to form excitons of the dopant molecules.

Figure 2:
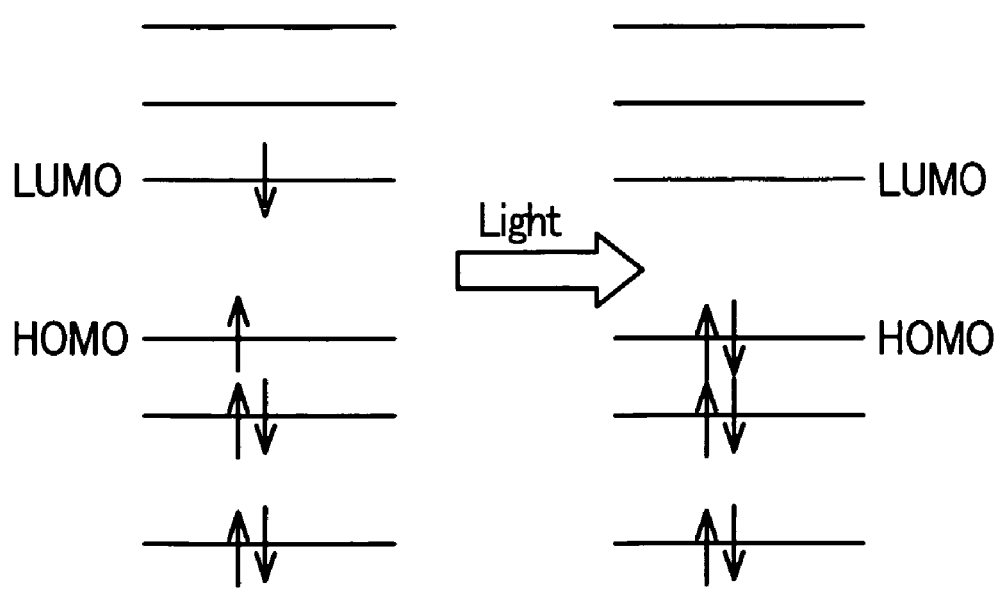
FIG. 2 is a view for explaining the energy orbitals of excitons of dopant molecules.

FIG. 2 explains energy orbitals of the exciton of the dopant molecule. As shown in FIG. 2, the dopant exciton formed as described above is an excited molecule having one electron in the HOMO (Highest Occupied Molecular Orbital) and one molecule in the LUMO (Lowest Unoccupied Molecular Orbital).

As the OLED element uses a material with a high fluorescence quantum yield as a dopant, the dopant exciton emits fluorescence and returns to the ground state.

One example of the normal light emission process of the OLED element has been described above. However, the current OLED element has a problem of gradual reduction in efficiency in a long-term light emission operation, which is the most important issue about the OLED element to address.

The degradation phenomena of the OLED element will be described in more detail below. When the OLED element is continuously energized by providing a constant amount of current to cause light emission, the following two primary degradation phenomena will occur: In the first phenomenon, the luminance gradually decrease, while in the second phenomenon, the voltage gradually increases. The decrease in luminance in the first phenomenon is believed to be attributable to decrease in dopant exciton producing efficiency in the light emitting layer, while the increase in voltage in the second phenomenon is believed to be attributable to decrease in mobility in the transport layer or a higher carrier injection barrier at the interface. However, it has not been well understood what chemical reaction causes the degradation.

The inventors have speculated that one of the factors that causes the degradation of the OLED element is contamination by a plasticizer in a clean room or in a vapor deposition apparatus. The plasticizer used herein is a low molecular weight compound used as an additive in plastic materials in order to impart flexibility to painting products or plastic products such as building materials. The most frequently used plasticizer is a dibasic acid ester compound.

Representative examples of such a plasticizer includes diethyl phthalate, dibutyl phthalate (hereinafter abbreviated to DBP), dioctyl phthalate (officially, bis(2-ethylhexyl) phthalate, hereinafter abbreviated to DOP), diisononyl phthalate (DINP), diisodecyl phthalate, diundecyl phthalate, bis (2-ethylhexyl) adipate, diisononyl adipate, and di-n-hexyl adipate. Among them, DOP, DBP and DINP are most generally used.

It is believed that plasticizers adhered to the OLED substrate on which ITO is deposited and plasticizers trapped in vapor deposited films, when energized to cause the OLED element to emit light, undergo an electrochemical reaction and become carrier trap sites as the decomposition reaction gradually proceeds. The light emission mechanism of the OLED element in the presence or absence of a plasticizer will be described below in terms of energy levels.

Figure 3:
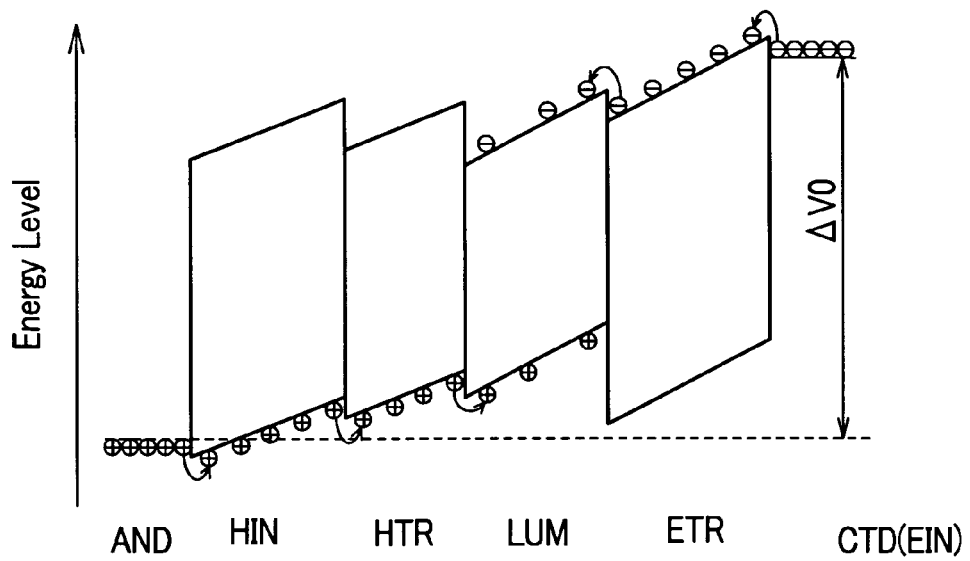
FIG. 3 is a view for explaining the light emission mechanism of the OLED element in terms of energy levels in the absence of a plasticizer.

FIG. 3 explains the light emission mechanism of the OLED element in terms of energy levels in the absence of a plasticizer. When the OLED element is energized, the materials of the hole injection layer and the hole transport layer are oxidized to radical cations, while the material of the electron transport layer is reduced to radical anions. These radical cations or radical anions oxidize or reduce adjacent molecules and the resultant carriers are transported one after another. In FIG. 3, a "circled minus sign" represents a radical anion, which represents a hole, while a "circled plus sign" represents a radical cation, which represents an electron.

In general, radical cations and radical anions are in relatively unstable states. A material used for the OLED element is selected such that the material is stable enough not to cause a structural change even when the material is in the state of these radical ions. Therefore, in the case of an element containing no impurity, oxidization and reduction occur between adjacent molecules in succession and resultant carriers are transported to the light emitting layer, as shown in FIG. 3. However, if the films contain a plasticizer, it reacts with the radical cations in the materials of the hole injection layer and the hole transport layer as well as with the radical anions in the material of the electron transport layer to form a level at which carriers are trapped, as shown in the following FIG. 4.

Figure 4:
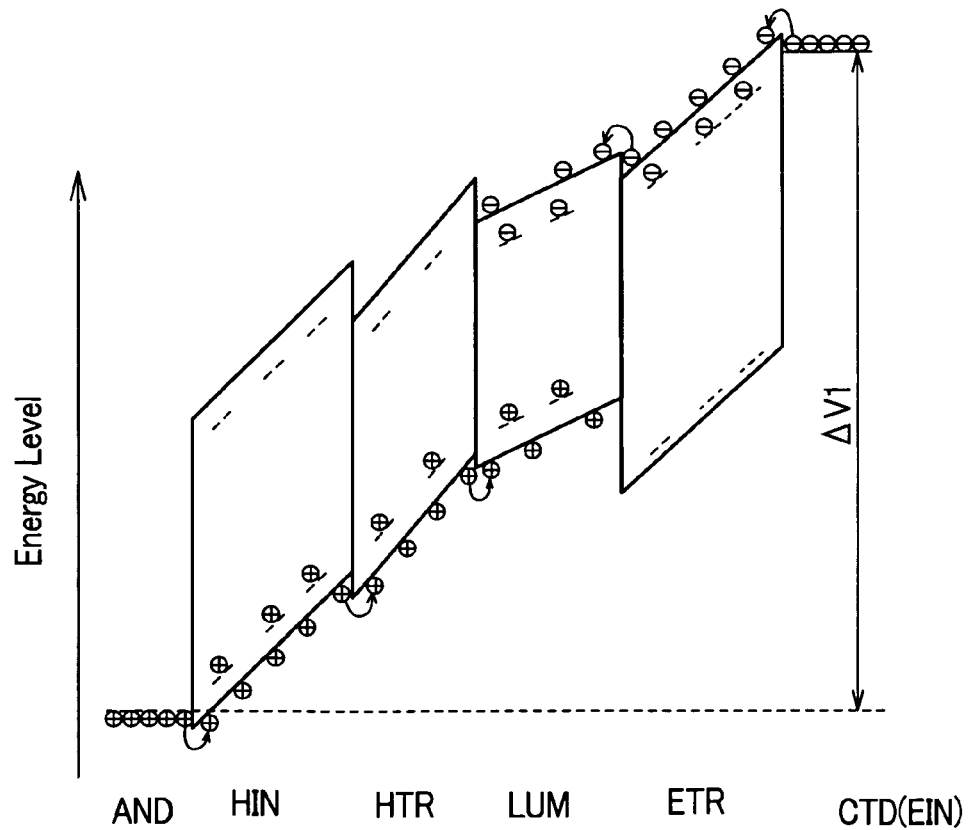
FIG. 4 is a view for explaining the light emission mechanism of the OLED element in terms of energy levels when a plasticizer becomes a carrier trap site.

FIG. 4 explains the light emission mechanism of the OLED element in terms of energy levels when a plasticizer becomes a carrier trap site. The traps in the hole injection layer and the hole transport layer trap holes and are therefore positively charged, resulting in decreased mobility. Thus, higher voltage is required to conduct a constant current. Similarly, the traps in the electron transport layer trap electrons and are therefore negatively charged, resulting in decreased mobility. Thus, higher voltage is required to conduct a constant current. The voltage applied across the cathode and the anode is initially $\Delta V_0$, as shown in FIG. 3, while the voltage of $\Delta V_1$ is required upon degradation, as shown in FIG. 4.

That is, the voltage increases by the amount of $\Delta V_1$-$\Delta V_0$. When traps are formed at the interface, charges are trapped there as well, so that the voltage increases. Since both holes and electrons are injected into the light emitting layer, an altered plasticizer in the light emitting layer forms both hole traps and electron traps, so that the voltage increases. The traps formed in the light emitting layer due to the altered plasticizer cause decrease in luminance as well as increase in voltage. That is, recombination of holes and electrons injected in the light emitting layer will occur in altered plasticizer molecules. The altered plasticizer does not have an ability to emit fluorescence, so that the recombination energy will be converted into heat. That is, the altered plasticizer becomes a heat inactivation site.

The inventors investigated how much the lifetime of the OLED element is shortened when a plasticizer is trapped in the OLED element as described above. DOP and DBP were used as plasticizers. Prepared OLED elements include those using ITO substrates (substrates on which ITO is deposited) to which plasticizers at various concentrations were adsorbed as well as those on which plasticizers at various concentrations were co-vapor deposited. The lifetimes of these elements were compared with each other to evaluate the effect of the plasticizers on the lifetimes of the elements. FIGS. 5 to 8 show the results.

Figure 5:
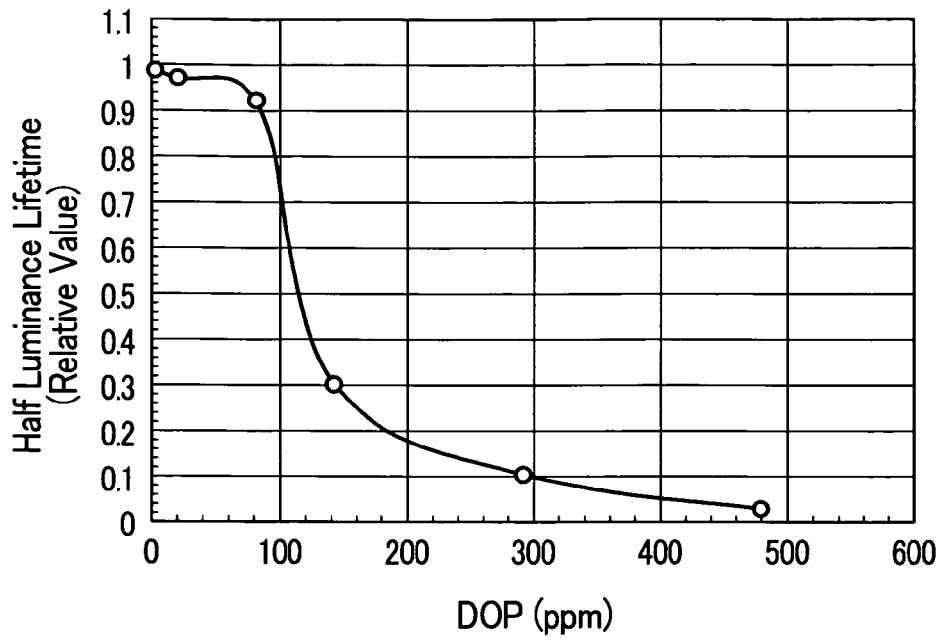
FIG. 5 shows the change in half luminance lifetime (relative value) when DOP is used as a plasticizer and the concentration of the DOP is changed.
Figure 6:
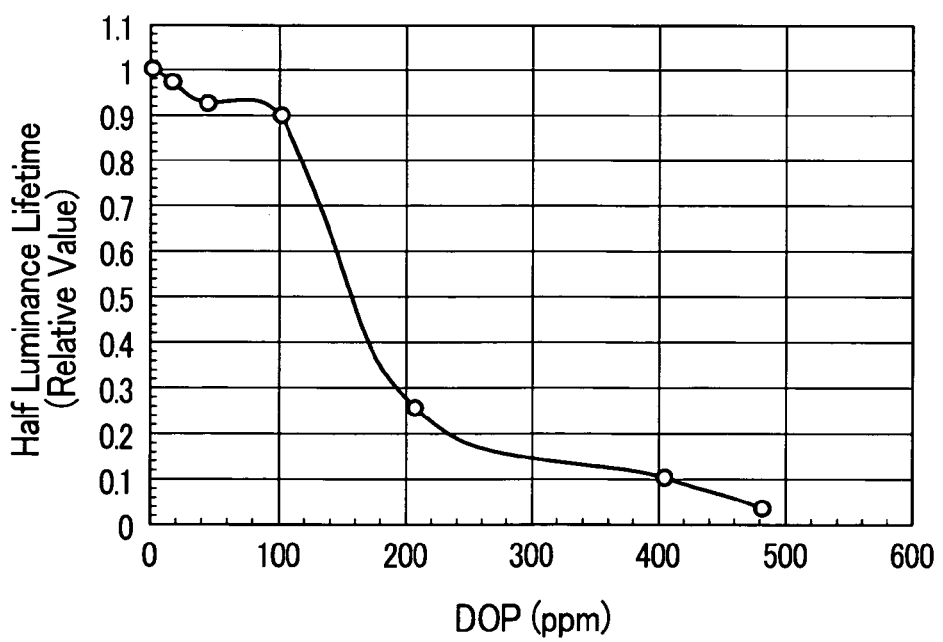
FIG. 6 shows the change in half luminance lifetime (relative value) when DBP is used as a plasticizer and the concentration of the DBP is changed.
Figure 7:
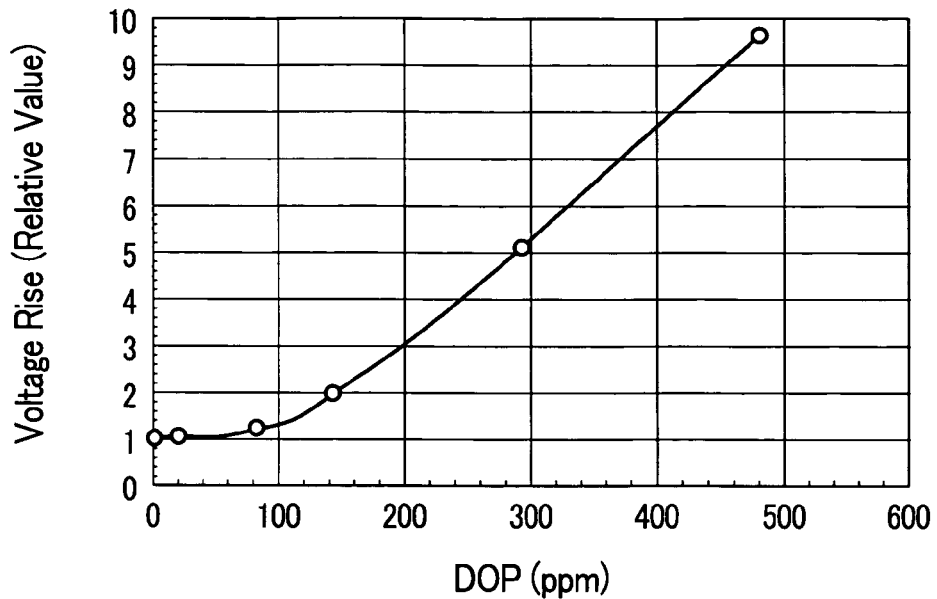
FIG. 7 shows the change in voltage rise when DOP is used as a plasticizer and the concentration of the DOP is changed.
Figure 8:
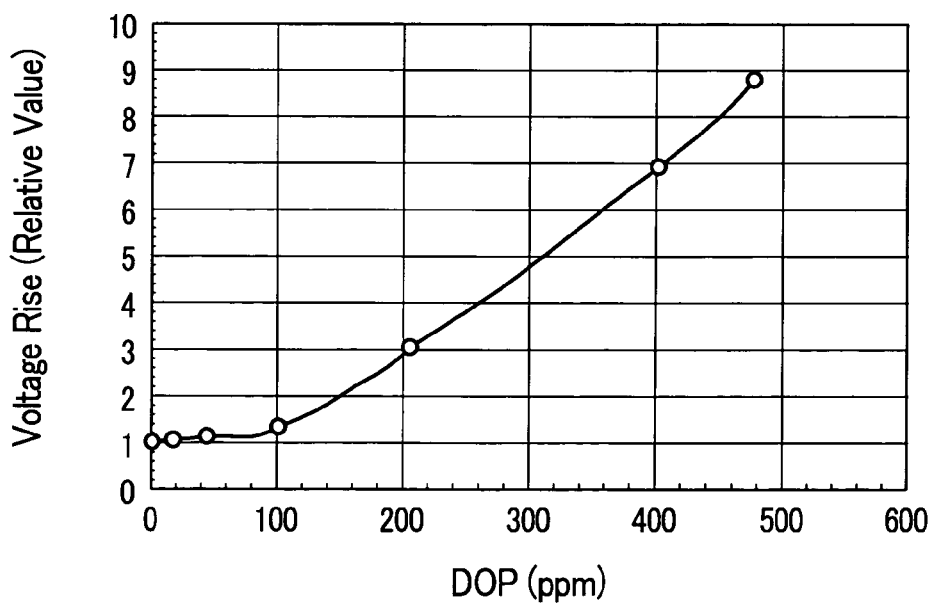
FIG. 8 shows the change in voltage rise when DBP is used as a plasticizer and the concentration of the DBP is changed.

FIG. 5 shows the change in half luminance lifetime (relative value) when DOP is used as a plasticizer and the concentration of the DOP is changed. FIG. 6 shows the change in half luminance lifetime (relative value) when DBP is used as a plasticizer and the concentration of the DBP is changed. FIG. 7 shows the change in voltage rise when DOP is used as a plasticizer and the concentration of the DOP is changed. FIG. 8 shows the change in voltage rise when DBP is used as a plasticizer and the concentration of the DBP is changed.

These investigation results show that when the amount of plasticizer is greater than 100 ppm, the lifetime of the element is sharply reduced. It is also shown that when the amount is less than or equal to 10 ppm, the changes in half luminance lifetime and voltage rise are very small.

From the above results, it has been shown that the lifetime of the OLED element can be significantly improved by limiting the amount of plasticizer in the OLED element to less than or equal to 100 ppm, preferably less than or equal to 10 ppm. Examples of an OLED element based on the above results and an organic electroluminescent display device using such an OLED element will be described.

EXAMPLE 1

Figure 9A:
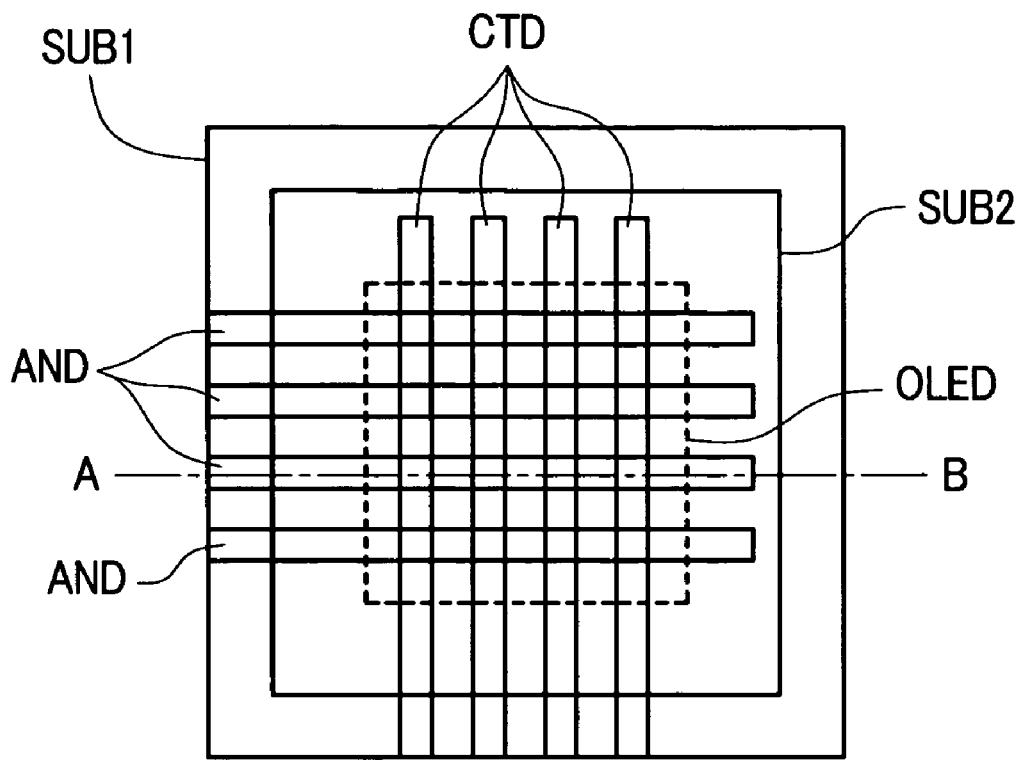
FIG. 9 is a diagrammatic view for explaining an example 1 of the organic electroluminescent display device according to the invention.
Figure 9B:
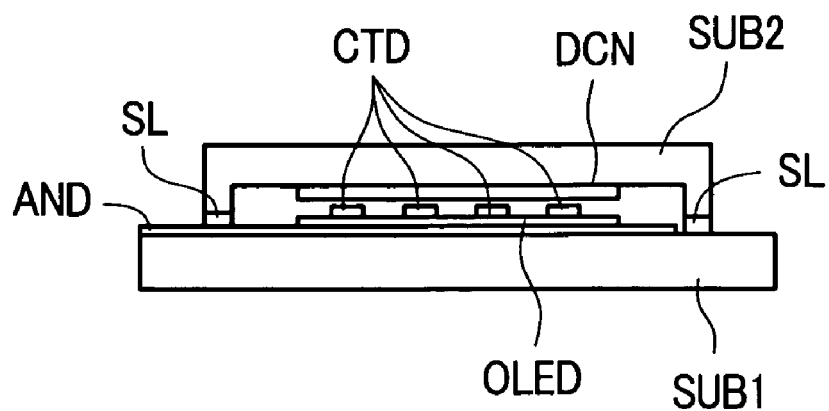

FIG. 9 is a diagrammatic view for explaining an example 1 of the organic electroluminescent display device according to the invention. FIG. 9(a) is a plan view and FIG. 9(b) is a cross-sectional view taken along the line A-B shown in FIG. 9(a). In FIG. 9, CVD was first used to deposit a silicon oxide film on a glass substrate SUB1 having a plate thickness of 7 mm and vertical and horizontal sizes of 50 mm by 50 mm. The silicon oxide film is a so-called underlying film. ITO for forming anodes was sputtered on the silicon oxide film, followed by a photolithography process to form a 1-mm width stripe pattern, thereby forming anodes AND.

As organic films that form an OLED, NPD, coumarin-doped Alq3, Alq3 and lithium fluoride were sequentially vapor deposited on a 20-mm by 20-mm portion at the center of the glass substrate SUB1 to form the OLED element structure. The thicknesses of the materials were 60 nm, 30 nm, 20 nm and 1 nm, respectively. Then, a 1-mm width pattern of aluminum (200 nm) was vapor deposited to form cathodes CTD such that they intersect the anodes AND at right angle. Finally, the glass substrate SUB1 was coated with an encapsulation cap SUB2 loaded with a desiccant DCN, and a UV curable sealing material SL was used to encapsulate the periphery of the encapsulation cap SUB2.

An element in which the glass substrate SUB1 was exposed to a plasticizer (DOP or DBP) vapor before the vapor deposition of the organic films, as well as an element in which the organic films and a plasticizer were co-vapor deposited were also fabricated. Different versions of such plasticizer-containing elements were fabricated by changing the exposure condition and the co-vapor deposition temperature of plasticizers.

The plasticizers contained in the various fabricated OLED elements were quantitatively analyzed by GC-MS (Gas Chromatogram-Mass Spectroscopy). The fabricated elements were energized by a constant direct current and how long it took the luminance to fall to half its initial value was measured. The difference between the initial voltage and the voltage when the luminance fell to half the initial value was defined as a voltage rise. The initial luminance in the energizing tests was 500 cd/m$^2$. As mentioned above, from the figures showing the above measurement results (FIGS. 5 to 8), an element with an extended lifetime is obtained when the amount of the plasticizer is less than or equal to 100 ppm, preferably less than or equal to 10 ppm.

Figure 10:
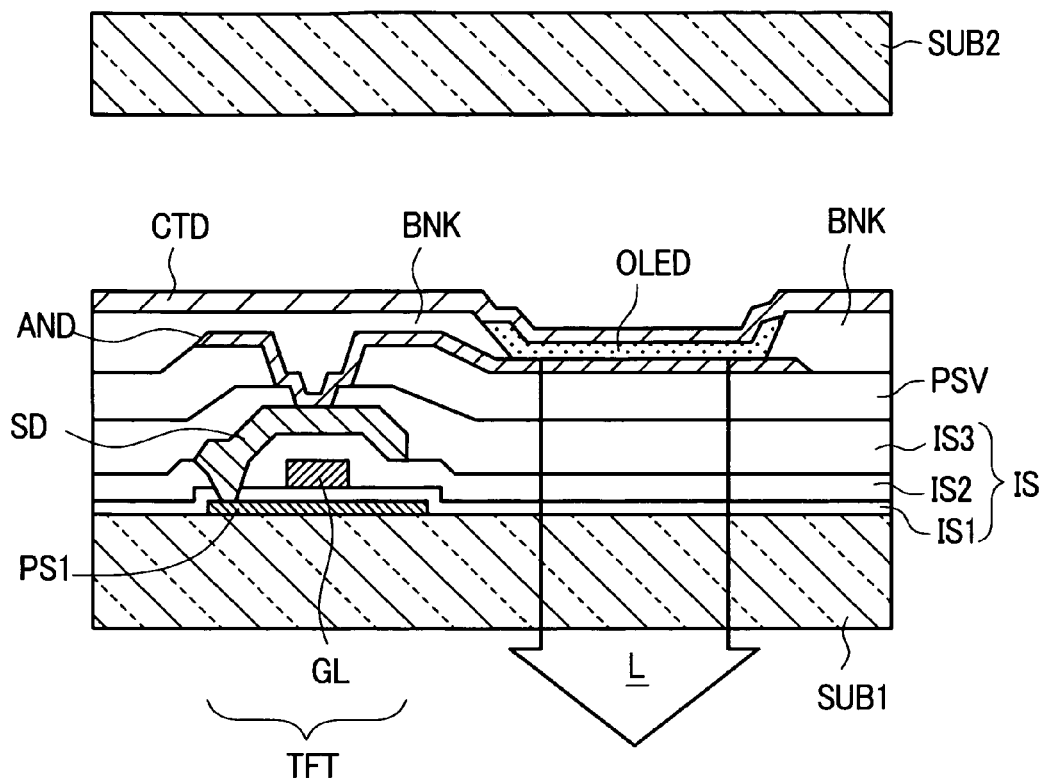
FIG. 10 is a cross-sectional view for explaining an exemplary configuration of one organic electroluminescent element, that is, one pixel and its adjacent portion, of a bottom emission type organic electroluminescent display device to which the invention is applied.

FIG. 10 is a cross-sectional view for explaining an exemplary configuration of one organic electroluminescent element, that is, one pixel and its adjacent portion, of a bottom emission type organic electroluminescent display device to which the invention is applied. The organic electroluminescent display device shown in FIG. 10 is an active matrix version and has a thin film transistor TFT on the principal surface of the glass substrate SUB1. The organic light emitting layer OLED is sandwiched between the anode AND, which is one electrode driven by this thin film transistor TFT, and the cathode CTD, which is the other electrode, thereby forming a light emitting portion. The thin film transistor TFT includes a polysilicon semiconductor layer PS1, a gate insulating layer IS1, a gate line (gate electrode) GL, source-drain electrodes SD, and interlayer insulating layers IS2 and IS3.

The organic light emitting layer OLED has, for example, at least the hole transport layer, light emitting layer, electron transport layer and electron injection layer stacked from the anode side. Some of organic light emitting layers also include the hole injection layer which may contain vanadium pentoxide under the hole transport layer.

The anode AND, which is a pixel electrode, is formed of a transparent conductive layer (such as ITO) deposited on a passivation layer PSV, and is electrically connected to the source-drain electrodes SD of the thin film transistor TFT via a contact hole that passes through the passivation layer PSV and the interlayer insulating layer IS3. Although the organic light emitting layer OLED is vapor deposited in a recess surrounded by a bank BNK formed of an insulating layer applied onto the anode AND, it may be formed by an application method, such as an ink jet method. The organic light emitting layer OLED and the bank BNK are coated with a cathode 14 in the form of a solid film.

This organic electroluminescent display device called a bottom emission type outputs the emission light L from the light emitting layer through the surface of the glass substrate SUB1 to the outside, as indicated by the arrow. Therefore, the cathode CTD is designed to be able to reflect light. The encapsulation can SUB2 (encapsulation glass substrate) is attached on the principal surface side of the glass substrate SUB1 and encapsulates the inside of the seal (not shown) that surrounds the periphery to provide a vacuum state.

Figure 11:
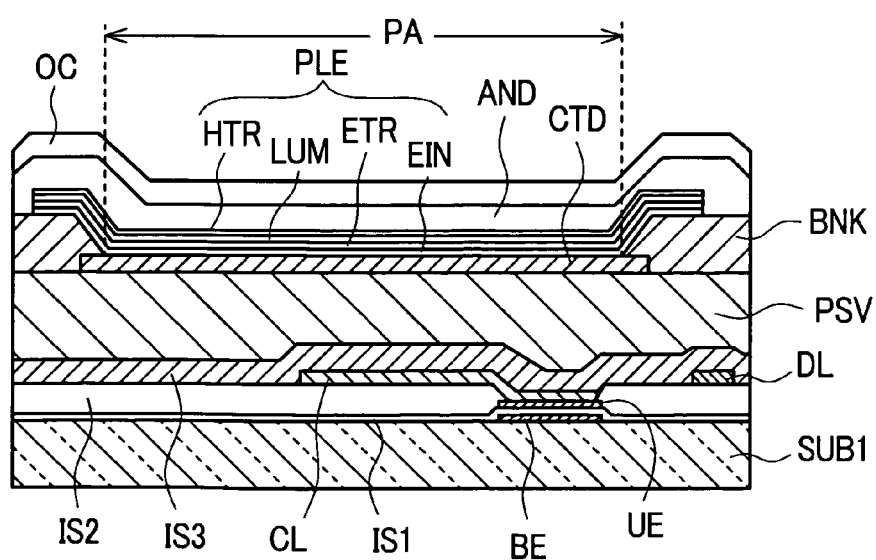
FIG. 11 is a cross-sectional view for explaining an exemplary configuration of one organic electroluminescent element, that is, one pixel and its adjacent portion, of a top emission type organic electroluminescent display device to which the invention is applied.

FIG. 11 is a cross-sectional view for explaining an exemplary configuration of one organic electroluminescent element, that is, one pixel and its adjacent portion, of a top emission type organic electroluminescent display device to which the invention is applied. Although the organic electroluminescent display device shown in FIG. 11 is also an active matrix version, the thin film transistor, which is an active element, is omitted in the figure. In this example, a capacitance structure that forms part of the organic electroluminescent element is shown.

In FIG. 11, on the principal surface of the glass substrate SUB1 are formed a lower capacitance electrode BE, a first insulating film IS1, which is a gate insulating film, an upper capacitance electrode UE, a second insulating film IS2, a power supply line CL, a signal line DL, a third insulating film IS3 and a passivation film (planarized film) PSV. The upper capacitance electrode UE is connected to the power supply line CL. The cathode CTD as a first electrode is deposited on the planarized film PSV.

The cathode CTD is deposited such that it spreads over a region PA, which corresponds to approximately one pixel, and the bank BNK made of an insulating material is formed at the end of the cathode CTD. Inside the bank BNK is the stacked organic electroluminescent layer OLE formed of the electron injection layer EIN, electron transport layer ETR, light emitting layer LUM and hole transport layer HTR. The organic electroluminescent layer OLE is covered with the anode AND, which is common to a plurality of pixels. Some of the organic electroluminescent layers also include the hole injection layer on the hole transport layer HTR.

The cathode CTD is made of reflective metal, while the anode AND is formed of a transparent conductive film made of, for example, ITO. A protective film OC is deposited as a top layer. Although not shown, the encapsulation substrate, preferably made of glass, is provided on the protective film OC, and encapsulates and separates the organic electroluminescent element from outside atmosphere.

Figure 12:
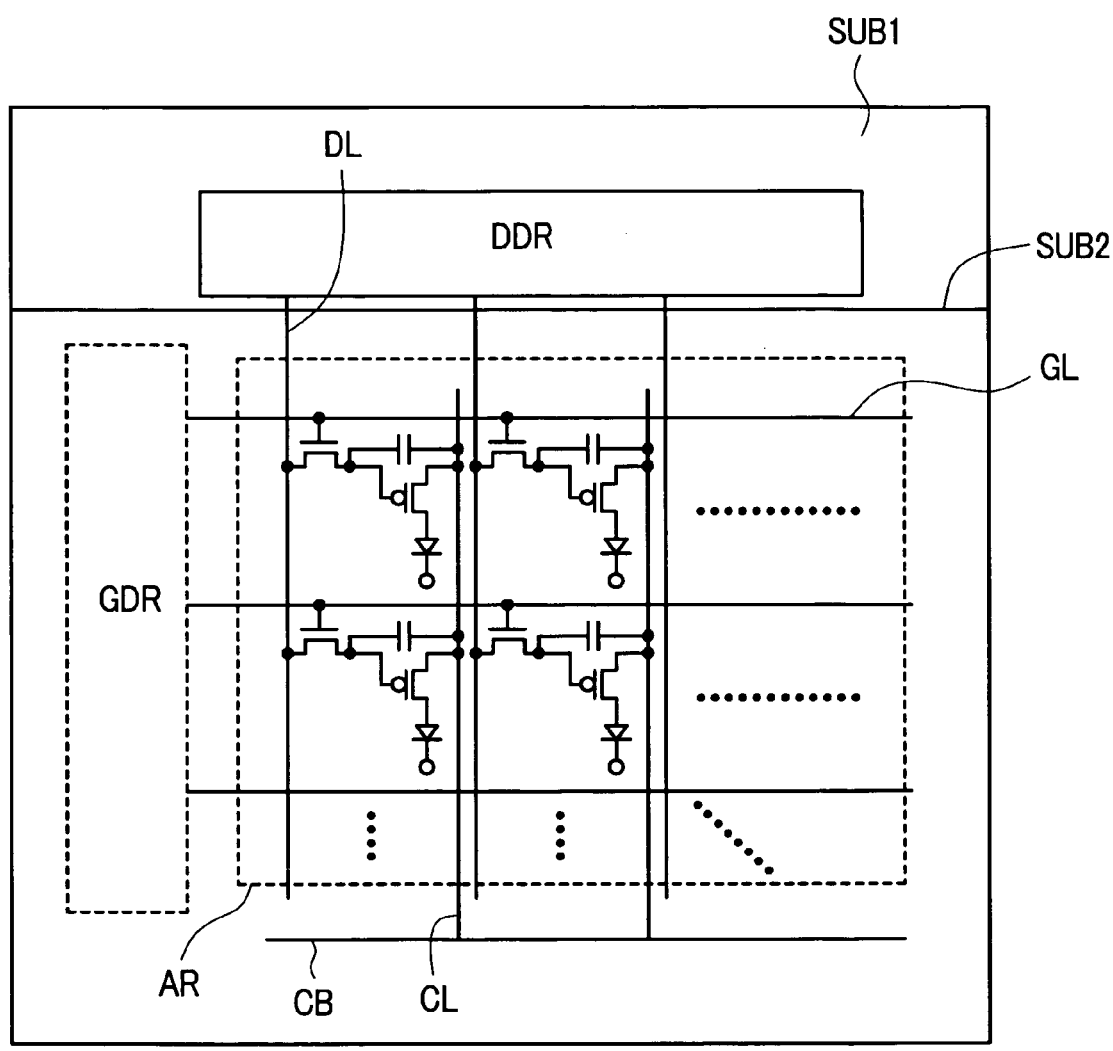
FIG. 12 is an equivalent circuit diagram for explaining an exemplary overall configuration of the organic electroluminescent display device.

FIG. 12 is an equivalent circuit diagram for explaining an exemplary overall configuration of the organic electroluminescent display device. Pixels PX, each formed of a pixel circuit that forms part of the OLED element configured as described in FIG. 10, are arranged in a matrix within a display area AR to form a two-dimensional display device. Each of the pixels PX includes a first thin film transistor TFT1 and a second thin film transistor TFT2, a capacitor Cs, and an OLED element (OLED). The OLED element (OLED) includes the anode AND, the organic light emitting layer OLED and the cathode CTD shown in FIG. 10. In the display area AR, drain lines DL and gate lines GL for supplying drive signals to the pixels are arranged such that they intersect with each other. The glass substrate SUB1 is larger in size than the glass substrate that forms the encapsulation can SUB2, so that part of the glass substrate SUB1 extends off the encapsulation can SUB2. On the extending-off portion is mounted a drain driver DDR, which supplies display signals to the drain lines DL.

On the other hand, a gate driver GDR is directly formed on the glass substrate SUB1, which is covered by the encapsulation can SUB2, in a so-called "system-on-glass" form. The gate lines GL are connected to the gate driver GDR. The power supply lines CL are disposed in the display area AR.

The power supply lines CL are connected to an external power supply at a terminal (not shown) via a power supply bus line CB.

The gate line GL is connected to one of the source-drain electrodes (the drain electrode in this example) of the first thin film transistor TFT1 that forms part of the pixel PX, while the drain line DL is connected to one of the source-drain electrodes (the source electrode in this example). The first thin film transistor TFT1 is a switch for supplying the display signal to the pixel PX, and the capacitor Cs stores charges according to the display signal supplied from the drain line DL when the switch is selected through the gate line GL and turned on. The second thin film transistor TFT2 turns on when the first thin film transistor TFT1 turns off and supplies a current according to the amount of the display signal stored in the capacitor Cs through the power supply line CL to the OLED element (OLED). The OLED element emits light according to the amount of the supplied current.

The invention claimed is:

1. An organic electroluminescent display device with a plurality of organic electroluminescent elements on the principal surface of an insulating substrate, the organic electroluminescent element comprising an anode, a cathode and an organic layer sandwiched between the anode and the cathode, wherein the concentration of a plasticizer contained in the organic layer is less than or equal to 100 ppm.

2. An organic electroluminescent display device with a plurality of organic electroluminescent elements on the principal surface of an insulating substrate, the organic electroluminescent element comprising an anode, a cathode and an organic layer sandwiched between the anode and the cathode, wherein the concentration of a plasticizer contained in the organic layer is less than or equal to 10 ppm.

3. The organic electroluminescent display device according to claim 1 or 2,
wherein the anode is deposited on the principal surface of the insulating substrate, the organic layer is formed on the anode, and the cathode is deposited on the organic layer.

4. The organic electroluminescent display device according to claim 3,
wherein the organic layer has at least a hole transport layer, a light emitting layer, an electron transport layer and an electron injection layer sequentially stacked from the anode side, and the cathode is deposited on the electron injection layer.

5. The organic electroluminescent display device according to claim 4,
wherein a hole injection layer is provided under the hole transport layer, and the hole injection layer contains vanadium pentoxide.

6. The organic electroluminescent display device according to claim 5,
further comprising an optically transparent encapsulation substrate on the anode, the encapsulation substrate encapsulating the organic electroluminescent elements.

7. The organic electroluminescent display device according to claim 1 or 2,
wherein the cathode is deposited on the principal surface of the insulating substrate, the organic layer is formed on the cathode, and the anode is deposited on the organic layer.

8. The organic electroluminescent display device according to claim 7,
wherein the organic layer has at least an electron injection layer, an electron transport layer, a light emitting layer and a hole transport layer sequentially stacked from the cathode side, and the anode is deposited on the hole transport layer.

9. The organic electroluminescent display device according to claim 8, wherein a hole injection layer is provided under the hole transport layer, and the hole injection layer contains vanadium pentoxide.

10. The organic electroluminescent display device according to claim 9, further comprising an optically transparent encapsulation substrate on the anode, the encapsulation substrate encapsulating the organic electroluminescent elements.

11. The organic electroluminescent display device according to claim 7, further comprising an optically transparent encapsulation substrate on the anode, the encapsulation substrate encapsulating the organic electroluminescent elements.

12. The organic electroluminescent display device according to claim 1 or 2, wherein the plasticizer is dioctyl phthalate.

13. The organic electroluminescent display device according to claim 1 or 2, wherein the plasticizer is dibutyl phthalate.

* * * * *